(12) United States Patent
Nakagwa et al.

(10) Patent No.: US 7,144,761 B2
(45) Date of Patent: Dec. 5, 2006

(54) SEMICONDUCTOR DEVICE AND METHOD FOR FABRICATING THE SAME

(75) Inventors: Hideo Nakagwa, Shiga (JP); Eiji Tamaoka, Hyogo (JP); Masafumi Kubota, Osaka (JP); Tetsuya Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/958,282

(22) Filed: Oct. 6, 2004

(65) Prior Publication Data

US 2005/0059231 A1   Mar. 17, 2005

Related U.S. Application Data

(62) Division of application No. 09/982,144, filed on Oct. 19, 2001, now abandoned.

(30) Foreign Application Priority Data

Oct. 26, 2000   (JP) .............................. 2000-327154

(51) Int. Cl.
   *H01L 21/48* (2006.01)
(52) U.S. Cl. .................. 438/118; 438/622; 257/758
(58) Field of Classification Search ............... 257/678, 257/773, 774, 775, 758; 438/118, 622
   See application file for complete search history.

(56) References Cited

U.S. PATENT DOCUMENTS

| | | | | |
|---|---|---|---|---|
| 5,654,245 A * | 8/1997 | Allen | ............... | 438/629 |
| 5,674,787 A | 10/1997 | Zhao et al. | | |
| 5,985,759 A * | 11/1999 | Kim et al. | ............... | 438/653 |
| 6,100,184 A * | 8/2000 | Zhao et al. | ............... | 438/638 |
| 6,136,707 A | 10/2000 | Cohen | | |
| 6,181,012 B1 | 1/2001 | Edelstein et al. | | |
| 6,200,900 B1 | 3/2001 | Kitch | | |
| 6,303,498 B1 | 10/2001 | Chen et al. | | |
| 6,326,301 B1 | 12/2001 | Venkatesan et al. | | |
| 6,430,458 B1 * | 8/2002 | Mosely et al. | ............... | 700/121 |

FOREIGN PATENT DOCUMENTS

| | | |
|---|---|---|
| JP | 03-058421 | 3/1991 |
| JP | 04-290249 | 10/1992 |
| JP | 05-121404 | 5/1993 |
| JP | 05-152448 | 6/1993 |
| JP | 10-233446 | 9/1998 |
| JP | 2000-058651 | 2/2000 |
| JP | 2000-091426 | 3/2000 |
| JP | 2000-183158 | 6/2000 |

OTHER PUBLICATIONS

May 18, 2004 Office Action for JP Application No. 2000-327154 (in Japanese).
Japanese Patent Office Feb. 22, 2005 Notice of Reasons of Rejection for JP-2000-327154.

* cited by examiner

*Primary Examiner*—Leonardo Andújar
(74) *Attorney, Agent, or Firm*—Nixon Peabody LLP; Donald R. Studebaker

(57) ABSTRACT

A semiconductor device includes metal interconnects made from a multi-layer film composed of a first metal film formed on a semiconductor substrate with an insulating film sandwiched therebetween and a second metal film deposited on the first metal film. An interlayer insulating film having a via hole is formed on the metal interconnects. A third metal film is selectively grown on the second metal film within the via hole, so that a plug can be formed from the third metal film.

10 Claims, 17 Drawing Sheets

FIG. 2

First process: Formation of multi-layer metal film (1) Formation of first barrier metal layer
↓
(2) Formation of first metal film
↓
(3) Formation of second barrier metal layer
↓
(4) Formation of second metal film
↓
(5) Formation of diffusion preventing film

FIG. 3

Second process: Formation first interlayer insulating film (1) Formation of first interlayer insulating film

FIG. 4

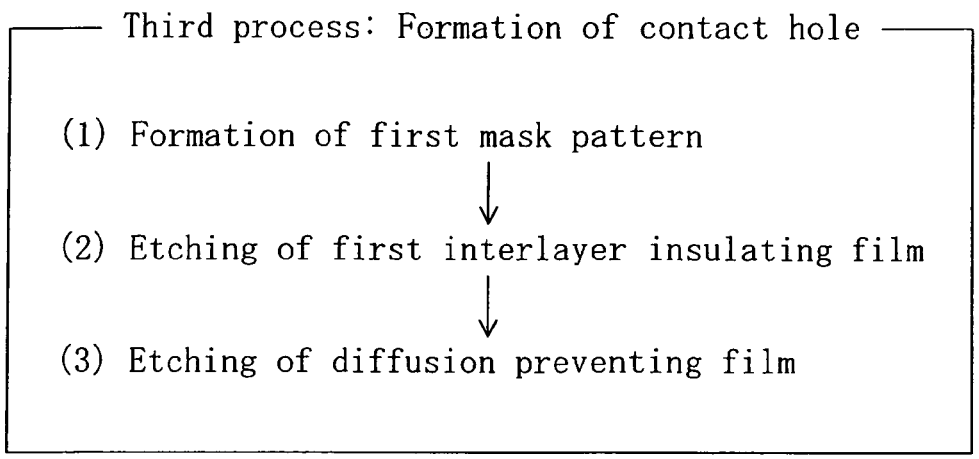

―― Third process: Formation of contact hole ――

(1) Formation of first mask pattern
↓
(2) Etching of first interlayer insulating film
↓
(3) Etching of diffusion preventing film

FIG. 5

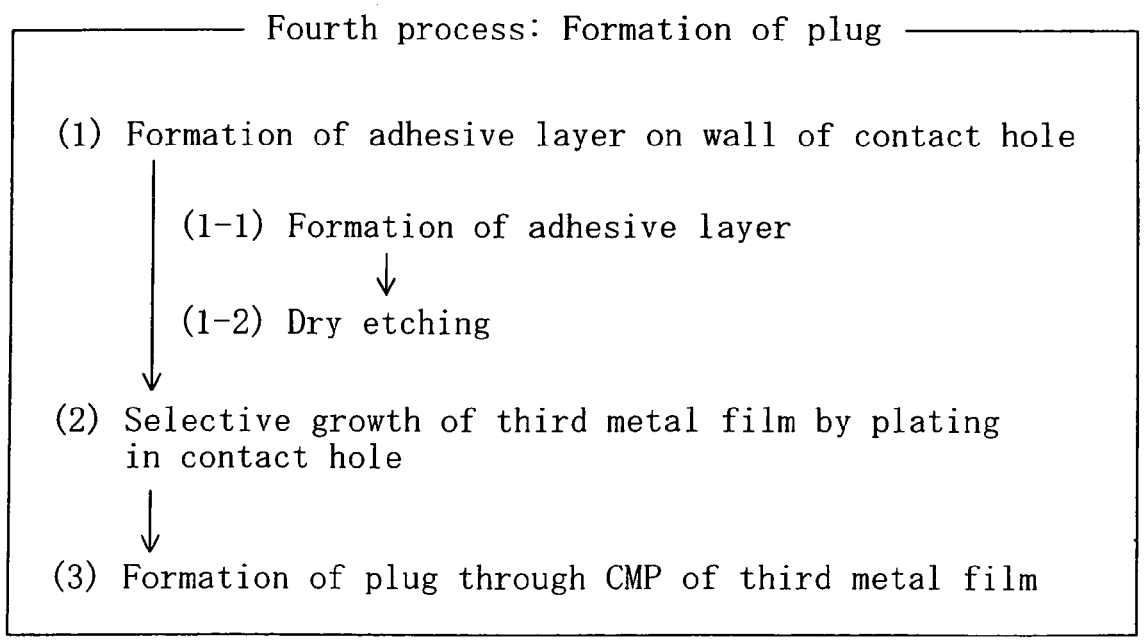

―――― Fourth process: Formation of plug ――――

(1) Formation of adhesive layer on wall of contact hole (1-1) Formation of adhesive layer
    ↓
    (1-2) Dry etching (2) Selective growth of third metal film by plating in contact hole
↓
(3) Formation of plug through CMP of third metal film

FIG. 7

Sixth process: Formation of second interlayer
insulating film (1) Formation of second interlayer insulating film

FIG. 8

Seventh process: Planarization of
second interlayer insulating film (1) Planarization by CMP

SEMICONDUCTOR DEVICE AND METHOD FOR FABRICATING THE SAME

BACKGROUND OF THE INVENTION

The present invention relates to a semiconductor device including metal interconnects and plugs connected to the metal interconnects, and a method for fabricating the same.

The processing dimension of the most advanced semiconductor devices currently mass-produced is 0.18 μm, which will be further reduced in the near future, and the processing dimension of the next generation will be definitely reduced to 0.15 μm, 0.13 μm and 0.1 μm successively. In such trend toward the dimensional reduction, alignment accuracy between a metal interconnect and a plug is preferably ±10% or less.

However, since metal interconnects are thus refined, it is difficult to realize the alignment accuracy of ±10% or less by employing lithography technique alone, and fine processing using a self-alignment method is indispensable.

Also, in currently used multi-layer interconnects, various techniques, such as a technique to use a material having a low dielectric constant k, namely, the so-called low-k material, as an interlayer insulating film and a technique to form an air gap between interconnects, have been developed in order to reduce interconnect delay.

Now, an example of a method for fabricating a semiconductor device including a plug and a metal interconnect by employing the self-alignment method developed for improving the alignment accuracy will be described with reference to FIGS. 17A through 17D, 18A through 18C, 19A through 19C and 20A through 20C.

First, as shown in FIG. 17A, an insulating film 11 of an insulating material is formed on a semiconductor substrate 10 by known chemical vapor deposition (CVD) or spin coating, and thereafter, a plug (not shown) connected to the semiconductor substrate 10 or an interconnect formed on the semiconductor substrate 10 is formed in the insulating film 11. The insulating film 11 is generally made from a silicon oxide film (with a dielectric constant k of approximately 4.3) or a low dielectric film having a dielectric constant lower than that of the silicon oxide film.

Next, as shown in FIG. 17B, a first barrier metal layer 12, a metal film 13 and a second barrier metal layer 14 are successively deposited on the insulating film 11, thereby forming a multi-layer metal film 15. The metal film 13 is made from an aluminum film deposited by known sputtering, and the first and second barrier metal layers 12 and 14 are deposited by the known sputtering and generally made from titanium nitride when the metal film 13 is made from an aluminum film.

Then, as shown in FIG. 17C, a first interlayer insulating film 16 of an insulating material is formed on the multi-layer metal film 15 by the CVD or spin coating, and then, a first resist pattern 17 is formed on the first interlayer insulating film 16 by known lithography.

Thereafter, as shown in FIG. 17D, the first interlayer insulating film 16 is dry etched by using the first resist pattern 17 as a mask, thereby forming via holes (via holes) 18 in the first interlayer insulating film 16.

Next, as shown in FIG. 18A, a conducting film 19 is deposited on the first interlayer insulating film 16 by the CVD so as to fill the via holes 18. The conducting film 19 is made from, for example, a tungsten film, and although not shown in the drawing, a barrier metal layer of a titanium film or a titanium nitride film is formed by the sputtering under the conducting film 19.

When the via hole 18 has an aspect ratio (a ratio of the depth to the diameter) higher than approximately 4, a void 20 is formed in the conducting film 19 within the via hole 18.

Then, a portion of the conducting film 19 present on the first interlayer insulating film 16 is removed by, for example, chemical mechanical polishing (CMP), so as to form plugs 21 as shown in FIG. 18B. Thereafter, the first interlayer insulating film 16 is dry etched so as to reduce the thickness of the first interlayer insulating film 16 as shown in FIG. 18C.

Subsequently, as shown in FIG. 19A, a second resist pattern 22 is formed on the first interlayer insulating film 16 with the reduced thickness, and then, the first interlayer insulating film 16 is dry etched by using the second resist pattern 22 as a mask, thereby forming a patterned first interlayer insulating film 16A as shown in FIG. 19B.

Next, the multi-layer metal film 15 is dry etched by using the plugs 21 and the patterned first interlayer insulating film 16A as a mask, thereby forming the multi-layer metal film 15 into metal interconnects 15A as shown in FIG. 19C. Since the plugs 21 and the metal interconnects 15A have a self-alignment structure in this manner, the positional shift between the plugs 21 and the metal interconnects 15A can be avoided.

The second resist pattern 22 is removed by ashing before or after the dry etching of the multi-layer metal film 15. Even when the second resist pattern 22 is removed after the dry etching of the multi-layer metal film 15, a portion of the second resist pattern 22 present on the plugs 21 is eliminated during the dry etching of the multi-layer metal film 15. Therefore, upper portions of the plugs 21 are slightly etched, and hence, openings 20a are formed in the upper portions of the voids 20.

Next, the insulating film 11 and the patterned first interlayer insulating film 16A are dry etched, thereby reducing the thicknesses of the insulating film 11 and the patterned first interlayer insulating film 16A as shown in FIG. 20A.

Then, as shown in FIG. 20B, a second interlayer insulating film 23 is deposited over the semiconductor substrate 10 by the CVD, thereby forming air gaps 24 between the metal interconnects 15A. Thereafter, the second interlayer insulating film 23 is planarized by the CMP as shown in FIG. 20C.

When the procedures of FIG. 17A through FIG. 20C are repeatedly carried out subsequently, a semiconductor device having a multi-layer interconnect structure including air gaps can be fabricated.

In the conventional method for fabricating a semiconductor device, however, when the via hole 18 has an aspect ratio higher than approximately 4, the voids 20 are formed within the plugs 21 as shown in FIG. 18B. Therefore, when the metal interconnects 15A having the air gaps 24 are formed, the complete openings 20a of the voids 20 are formed in the plugs 21 as shown in FIG. 20C.

Accordingly, the electric resistance between the plug 21 and an upper metal interconnect formed on the second interlayer insulating film 23 is largely increased, which causes a problem that the device characteristic is degraded.

In this case, when the electric resistance between the contact plug 21 and the upper metal interconnect is large beyond the limit, the reliability of the metal interconnect structure is largely lowered, and the semiconductor device cannot be operated in the worst case.

Furthermore, in the planarization of the second interlayer insulating film 23 by the CMP, an abrasive used in the CMP enters the voids 20, which causes a problem that the plugs 21 are corroded by the abrasive.

SUMMARY OF THE INVENTION

In consideration of the aforementioned conventional problems, an object of the invention is fabricating a high performance and highly reliable semiconductor device without forming a void in a plug formed in a via hole even when the via hole has a high aspect ratio.

In order to achieve the object, the semiconductor device of this invention comprises metal interconnects made from a multi-layer film composed of a first metal film deposited on a semiconductor substrate with an insulating film sandwiched therebetween and a second metal film deposited on the first metal film; an interlayer insulating film formed on the metal interconnects; and a plug made from a third metal film selectively grown on the second metal film within a via hole formed in the interlayer insulating film.

In the semiconductor device of this invention, the plug is made from the third metal film selectively grown on the second metal film within the via hole, and hence, no void is formed in the plug. Accordingly, the performance and the reliability of the semiconductor device can be improved.

In the semiconductor device, the third metal film is preferably grown by plating.

Thus, the third metal film can be definitely grown on the second metal film, and hence, the performance and the reliability of the semiconductor device can be definitely improved.

In the semiconductor device, the second metal film and the third metal film are preferably made from the same kind of metal.

Thus, the third metal film can be definitely grown on the second metal film, and hence, the performance and the reliability of the semiconductor device can be definitely improved.

In the semiconductor device, it is preferred that the second metal film and the third metal film are made from a metal including copper as a principal constituent, that the third metal film is grown by plating, and that no adhesive layer is formed between the second metal film and the third metal film.

When the second metal film and the third metal film are made from the metal including copper as a principal constituent and the third metal film is selectively grown by the plating, a plug having low resistance and low contact resistance with the metal interconnect can be definitely formed.

In the semiconductor device, an air gap is preferably formed between the metal interconnects in the interlayer insulating film.

Thus, the dielectric constant of the interlayer insulating film between the metal interconnects can be reduced, so as to lower the capacitance between the metal interconnects.

In the semiconductor device, the first metal film composing the metal interconnects preferably has interconnect resistance substantially 1/5 or less of interconnect resistance of the second metal film composing the metal interconnects.

Thus, a current flowing through the metal interconnect substantially flows through the first metal film and minimally through the second metal film, and therefore, work can be divided between the first metal film and the second metal film, so that the first metal film can work as an interconnect for allowing a current to flow therethrough and the second metal film can work as a seed layer for growing the third metal film. Accordingly, materials optimal for the works of the first metal film and the second metal film can be selected.

In the semiconductor device, the first metal film composing the metal interconnects has interconnect resistance substantially equivalent to interconnect resistance of the second metal film composing the metal interconnects.

Thus, the phase in a distributed constant circuit of a current flowing through the first metal film and the phase in a distributed constant circuit of a current flowing through the second metal film are substantially the same in the entire metal interconnects, and therefore, turbulence of a signal propagated by a current flowing through the metal interconnect can be minimized.

The method for fabricating a semiconductor device of this invention comprises the steps of depositing a first metal film on a semiconductor substrate with an insulating film sandwiched therebetween; depositing a second metal film on the first metal film; forming an interlayer insulating film on the second metal film; forming a via hole in the interlayer insulating film so as to expose the second metal film within the via hole; forming a plug of a third metal film selectively grown on the second metal film within the via hole; forming a patterned interlayer insulating film by patterning the interlayer insulating film into the shape of interconnects; and forming metal interconnects from a multi-layer film composed of the first metal film and the second metal film by etching the multi-layer film with the plug and the patterned interlayer insulating film used as a mask.

In the method for fabricating a semiconductor device of this invention, after forming the interlayer insulating film on the second metal film, the via hole is formed in the interlayer insulating film so as to expose the second metal film within the via hole. Thereafter, the third metal film is selectively grown on the second metal film within the via hole, so as to form the plug from the third metal film. Therefore, a seed layer of the second metal film with a uniform desired thickness can be formed on the bottom of the via hole. Accordingly, the third metal film can be definitely grown, so as to form a good plug free from voids.

In the method for fabricating a semiconductor device, the third metal film is preferably grown by plating.

Thus, the third metal film can be definitely grown on the second metal film, so as to definitely improve the performance and the reliability of the semiconductor device.

In the method for fabricating a semiconductor device, the second metal film and the third metal film are preferably made from the same type of metal.

Thus, the third metal film can be definitely grown on the second metal film, so as to definitely improve the performance and the reliability of the semiconductor device.

In the method for fabricating a semiconductor device, the second metal film and the third metal film are preferably made from a metal including copper as a principal constituent, and the third metal film is preferably grown by plating on the second metal film with no adhesive layer sandwiched therebetween.

Thus, a plug having low resistance and low contact resistance with the metal interconnect can be definitely formed.

BRIEF DESCRIPTION OF THE DRAWINGS

FIG. 2 is a diagram for explaining a first process of the method for fabricating a semiconductor device of Embodiment 1;

FIG. 3 is a diagram for explaining a second process of the method for fabricating a semiconductor device of Embodiment 1;

FIG. 4 is a diagram for explaining a third process of the method for fabricating a semiconductor device of Embodiment 1;

FIG. 5 is a diagram for explaining a fourth process of the method for fabricating a semiconductor device of Embodiment 1;

FIG. 7 is a diagram for explaining a sixth process of the method for fabricating a semiconductor device of Embodiment 1;

FIG. 8 is a diagram for explaining a seventh process of the method for fabricating a semiconductor device of Embodiment 1;

DETAILED DESCRIPTION OF THE INVENTION

Embodiment 1

A semiconductor device and a method for fabricating the same according to Embodiment 1 of the invention will now be described with reference to the accompanying drawings.

Figure 1:
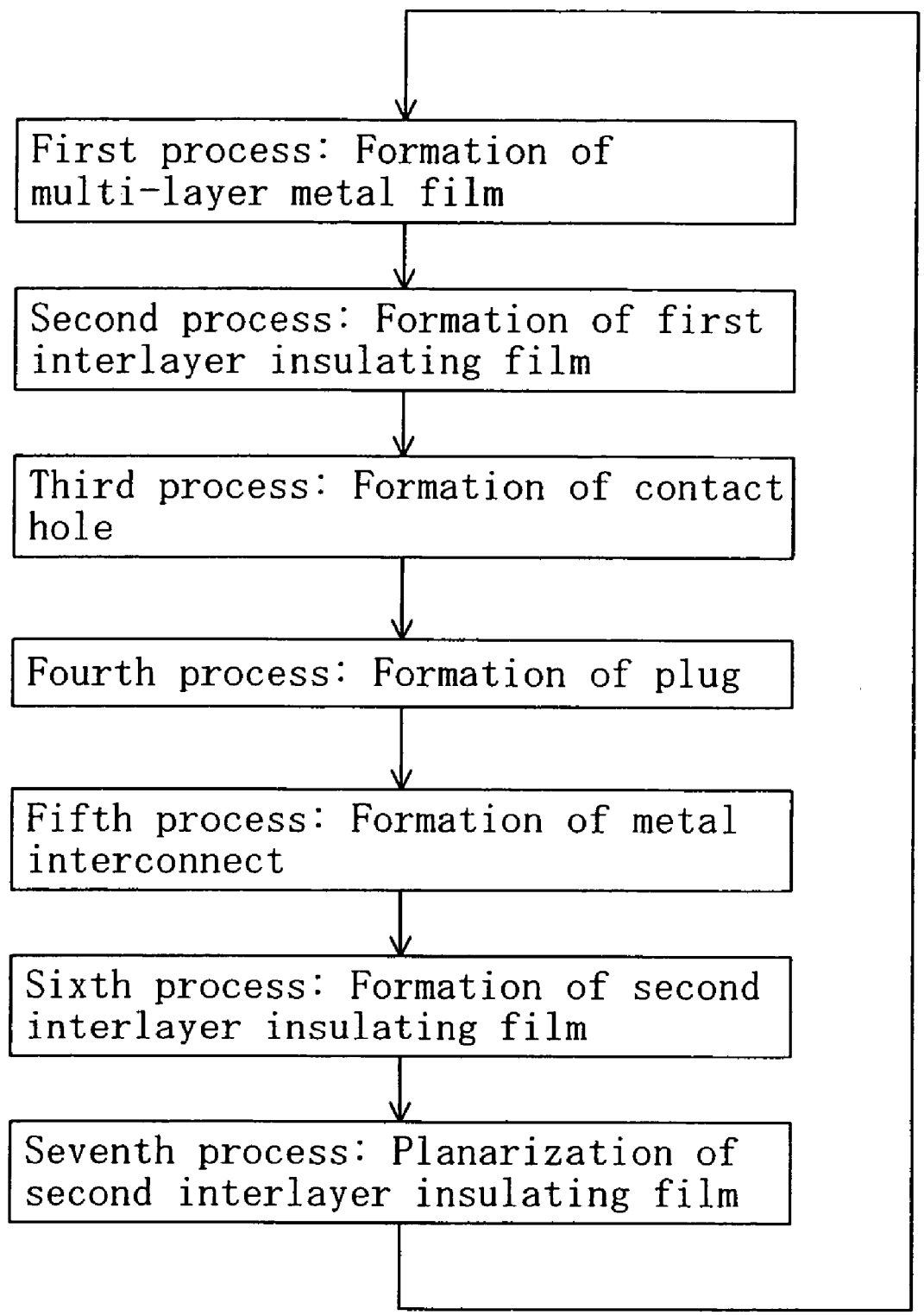
FIG. 1 is a sequence diagram for explaining a method for fabricating a semiconductor device according to Embodiment 1 of the invention.
Figure 6:
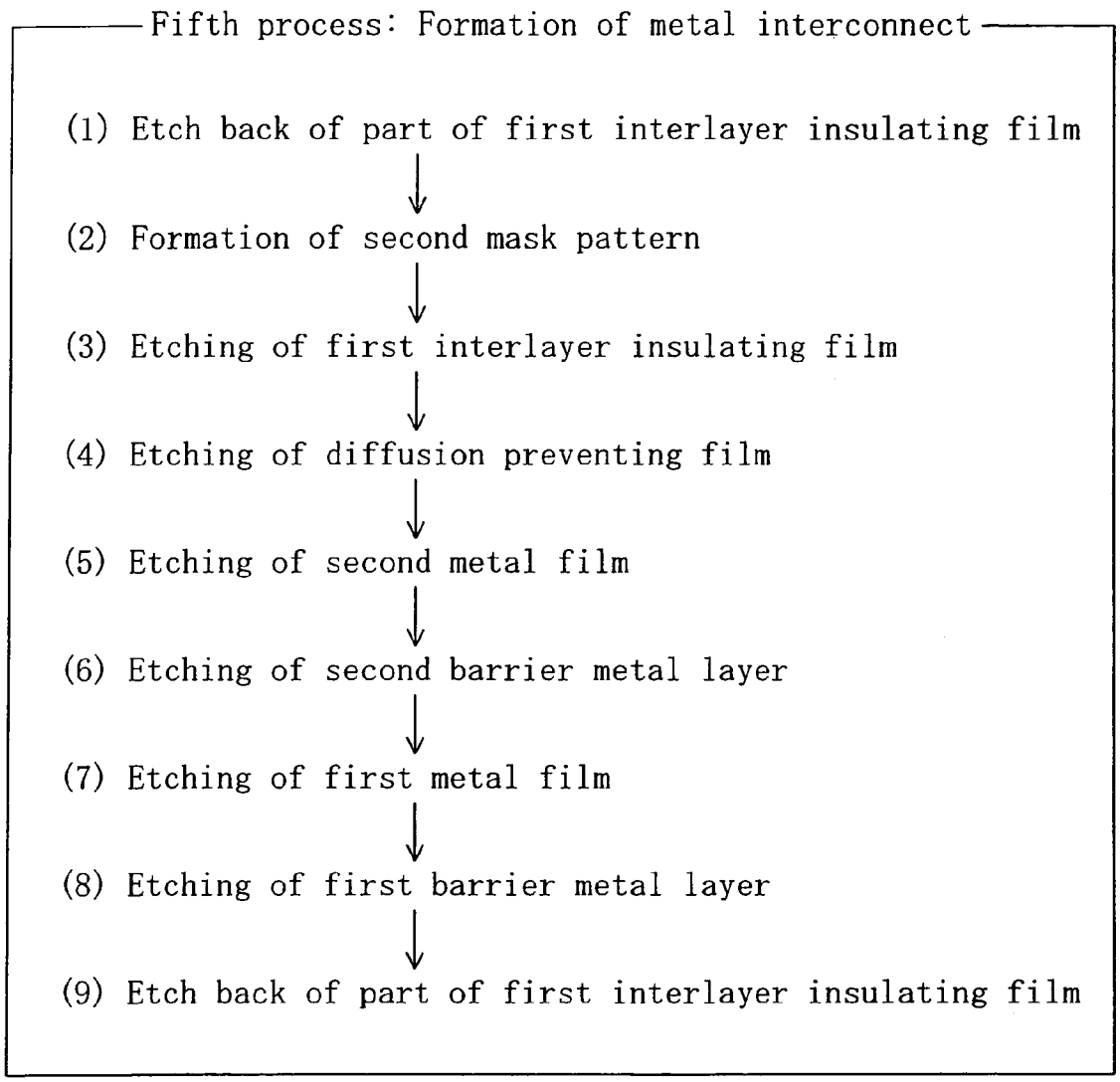
FIG. 6 is a diagram for explaining a fifth process of the method for fabricating a semiconductor device of Embodiment 1.

FIG. 1 is a sequence diagram of the method for fabricating a semiconductor device of Embodiment 1. As shown in FIG. 1, the method for fabricating a semiconductor device of Embodiment 1 includes a first process for forming a multi-layer metal film on an insulating film on a semiconductor substrate; a second process for forming a first interlayer insulating film on the multi-layer metal film; a third process for forming a via hole reaching the multi-layer metal film in the first interlayer insulating film; a fourth process for forming a plug by filling a conducting film in the via hole; a fifth process for forming a metal interconnect by patterning the multi-layer metal film; a sixth process for forming a second interlayer insulating film; and a seventh process for planarizing the second interlayer insulating film.

Also, a semiconductor device having a multi-layer interconnect structure can be fabricated by repeatedly carrying out the first through seventh processes.

The first through seventh processes will now be described in detail with reference to the accompanying drawings.

<First Process>

The first process for forming a multi-layer metal film on an insulating film on a semiconductor substrate will now be described with reference to FIGS. 2 and 9A through 9D.

Figure 9A:
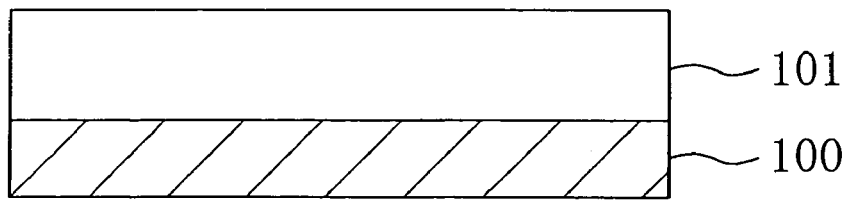
FIGS. 9A, 9B, 9C and 9D are cross-sectional views for showing procedures in the method for fabricating a semiconductor device of Embodiment 1.

First, as shown in FIG. 9A, an insulating film 101 of an insulating material is formed on a semiconductor substrate 100 by CVD or spin coating, and a plug (not shown) connected to the semiconductor substrate 100 or an interconnect formed on the semiconductor substrate 100 is formed in the insulating film 101. The insulating film 101 is made from a silicon oxide film (with a dielectric constant k of approximately 4.3) or a low dielectric film (so-called low-k film) having a dielectric constant lower than that of the silicon oxide film. The low dielectric film may be an organic film of an aromatic polymer or the like, an inorganic film such as a silicon oxide film including fluorine (fluorinated silicate glass), or an organic-inorganic hybrid film such as a silicon oxide film including a methyl group or the like. Alternatively, the insulating film may be a porous film that is made from a ULK (ultra low-k) film having a dielectric constant lower than that of the low-k film, has a Si—Si bond and a Si—O bond and includes pores therein.

Figure 9B:
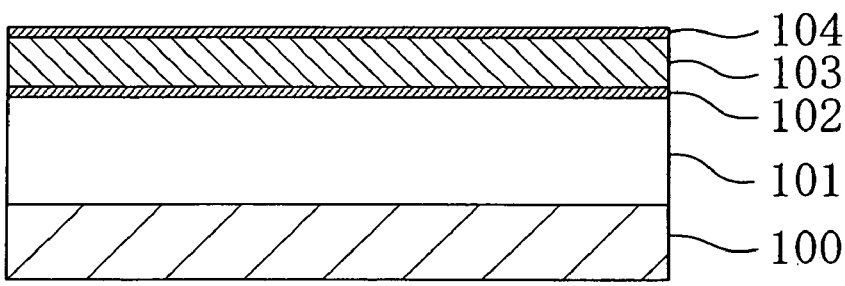
Figure 9C:
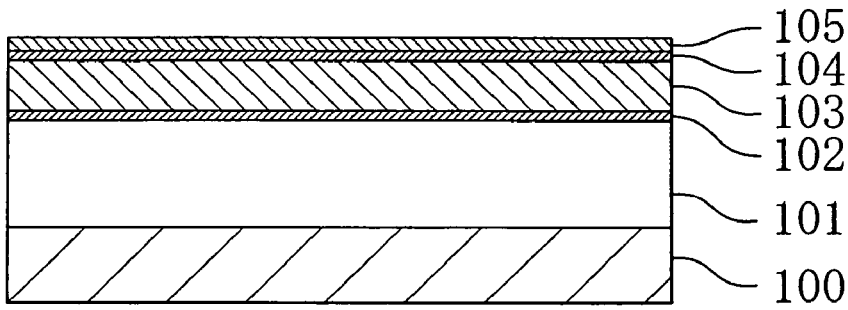
Figure 9D:
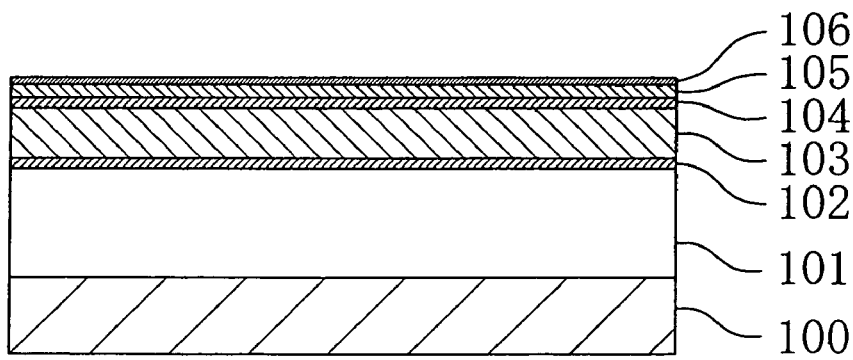

Next, a first barrier metal layer 102, a first metal film 103 and a second barrier metal layer 104 are successively deposited on the insulating film 101 as shown in FIG. 9B, and a second metal film 105 is deposited on the second barrier metal layer 104 as shown in FIG. 9C. Thereafter, a diffusion preventing film 106 is deposited on the second metal film 105 as shown in FIG. 9D.

The first metal film 103 can be formed by sputtering, CVD or plating and made from a material with a low resistance, such as an aluminum alloy, gold, silver, copper and platinum. The second metal film 105 can be formed by the sputtering, CVD or plating and made from a material with a low resistance, such as gold, silver, copper and platinum.

The first and second barrier metal layers 102 and 104 are preferably made from a film for improving adhesion and preventing diffusion of the metal, such as either a titanium film or a titanium nitride film, or either a tantalum film or a tantalum nitride film.

The diffusion preventing film 106 should be a film capable of preventing diffusion of the metal included in the second metal film 105, and can be, for example, a silicon nitride film or a silicon carbide film deposited by the CVD. Also, the diffusion preventing film 106 is preferably a film with a low dielectric constant and high adhesion.

In the case where the metal included in the first metal film 103 is difficult to diffuse, the first and second barrier metal layers 102 and 104 may be omitted, and in the case where the second metal film 105 has high adhesion and is difficult to diffuse, the diffusion preventing film 106 may be omitted.

<Second Process>

The second process for forming a first interlayer insulating film on the multi-layer metal film will now be described with reference to FIGS. 3 and 10A.

Figure 10A:
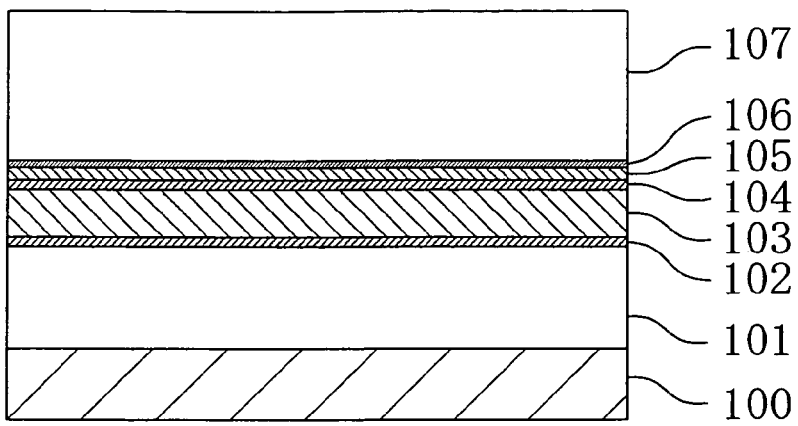
FIGS. 10A, 10B and 10C are cross-sectional views for showing other procedures in the method for fabricating a semiconductor device of Embodiment 1.

As shown in FIG. 10A, a first interlayer insulating film 107 of an insulating material is formed by the CVD or spin coating on the diffusion preventing film 106 included in the multi-layer metal film. The first interlayer insulating film 107 may be a silicon oxide film; a low-k film, such as an organic film of an aromatic polymer or the like, an inorganic film like a silicon oxide film including fluorine and an organic-inorganic hybrid film like a silicon oxide film including a methyl group; or a ULK film like a porous film having a Si—Si bond and a Si—O bond and including pores therein.

<Third Process>

The third process for forming a via hole in the first interlayer insulating film will now be described with reference to FIGS. 4, 10B and 10C.

Figure 10B:
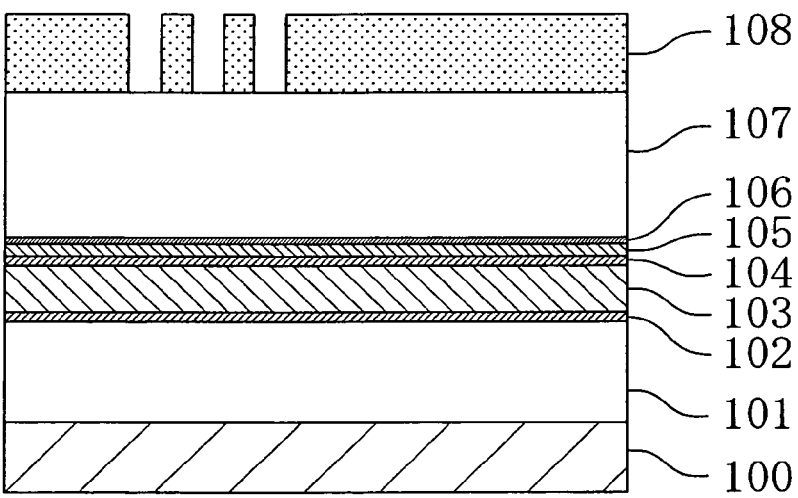
Figure 10C:
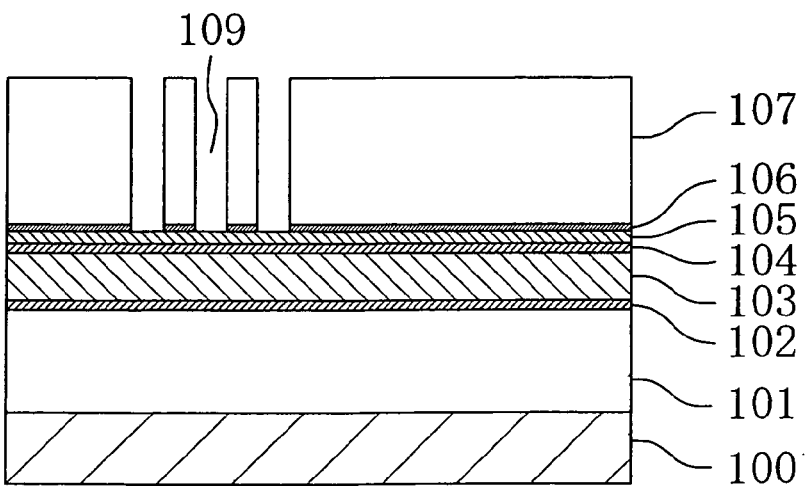

As shown in FIG. 10B, after forming a first mask pattern 108 on the first interlayer insulating film 107 by known lithography, the first interlayer insulating film 107 and the diffusion preventing film 106 are subjected to plasma etching using a gas including flon as a principal constituent with the first mask pattern 108 used as a mask. Thus, via holes 109 are formed in the first interlayer insulating film 107 and the diffusion preventing film 106 as shown in FIG. 10C.

The first mask pattern 108 is preferably a resist pattern when the first interlayer insulating film 107 is made from an inorganic film or an organic-inorganic hybrid film, and is preferably a hard mask of a silicon oxide film or the like when the first interlayer insulating film 107 is made from an organic film.

The plasma etching of the first interlayer insulating film 107 and the diffusion preventing film 106 may be continuously carried out or separately carried out in two procedures.

<Fourth Process>

The fourth process for forming a plug will now be described with reference to FIGS. 5, 11A through 11C and 12A.

Figure 11A:
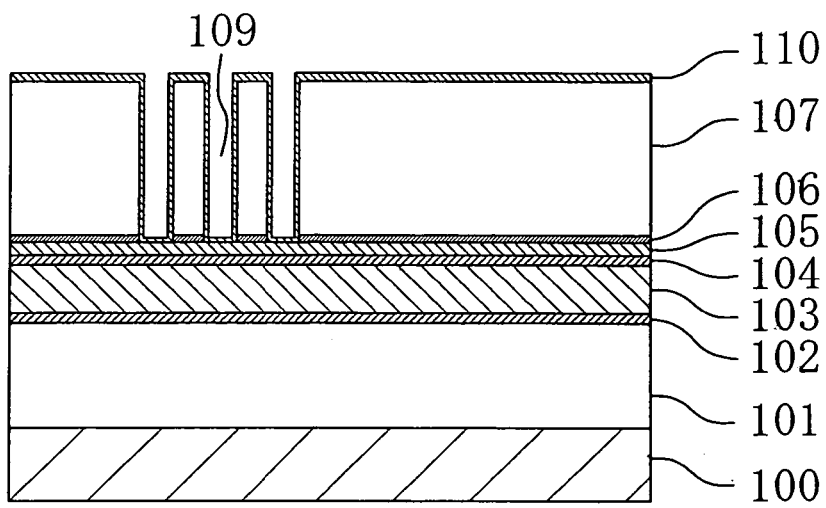
FIGS. 11A, 11B and 11C are cross-sectional views for showing still other procedures in the method for fabricating a semiconductor device of Embodiment 1.
Figure 11B:
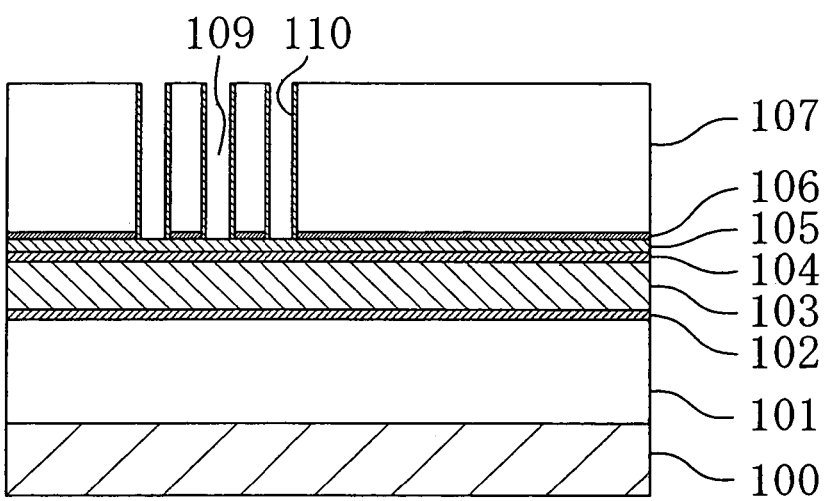
Figure 11C:
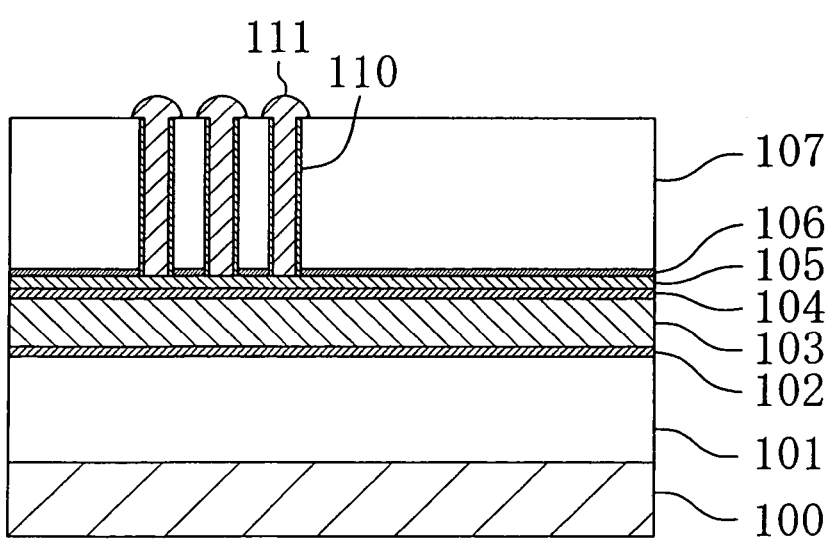

First, as shown in FIG. 11A, an adhesive layer 110 is deposited over the first interlayer insulating film 107 and the walls and bottoms of the via holes 109 by the CVD or sputtering.

Next, the adhesive layer 110 is subjected to anisotropic etching using plasma of, for example, an etching gas including flon as a principal constituent. Thus, portions of the adhesive layer 110 present on the bottoms of the via holes 109 and the top face of the first interlayer insulating film 107 are removed, so as to allow the adhesive layer 110 to remain on the walls of the via holes 109 alone. Thereafter, the face of the second metal film 105 exposed on the bottoms of the via holes 109 is cleaned by sputtering using plasma of, for example, an argon gas or a mixed gas of argon and hydrogen.

Figure 12A:
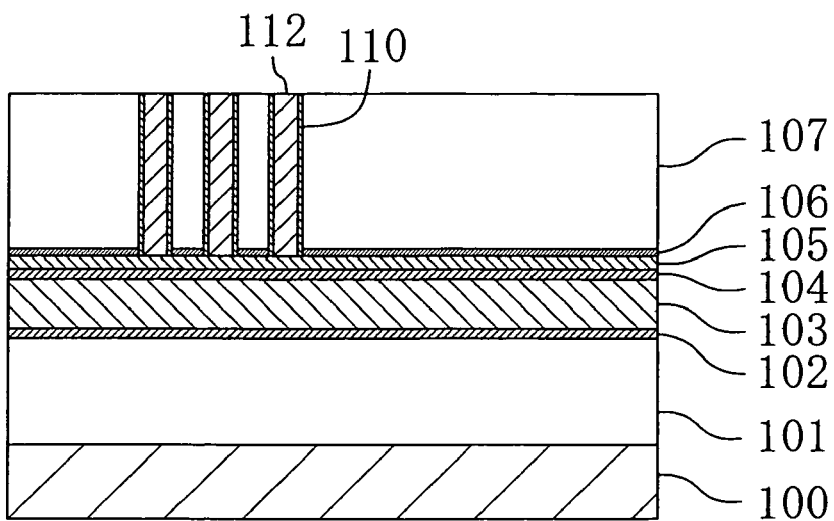
FIGS. 12A, 12B and 12C are cross-sectional views for showing still other procedures in the method for fabricating a semiconductor device of Embodiment 1.

Then, as shown in FIG. 1C, a third metal film 111 is selectively grown by the plating on the face of the second metal film 105 exposed on the bottoms of the via holes 109, and thereafter, a portion of the third metal film 111 present on and above the first interlayer insulating film 107 is removed by the CMP. Thus, plugs 112 are formed from the third metal film 111 as shown in FIG. 12A.

The third metal film 111 can be made from a metal with a low resistance such as gold, silver, copper and platinum, and can be the same as or different from the second metal film 105. When the third metal film 111 is made from the same metal as the second metal film 105, the third metal film 111 can be easily grown not only by electroless plating but also by electrolytic plating.

The third metal film 111 can be grown by the electroless plating or the electrolytic plating. However, since the second metal film 105 is present in the shape of a sheet on the semiconductor substrate 100, the third metal film 111 can be easily grown by the electrolytic plating.

The adhesive layer 110 may be an insulating film such as a silicon nitride film and a silicon carbide film, and is preferably made from a material capable of preventing the metal included in the third metal film 111 from diffusing into the first interlayer insulating film 107. Accordingly, the material of the adhesive layer 110 is preferably selected in consideration of compatibility with the third metal film 111.

The following two methods for forming a plug are conventionally known: In the first method, a metal film such as a tungsten film is filled in a via hole by the CVD; and in the second method, a seed layer is formed over an interlayer insulating film including the bottom of a via hole by the sputtering, and a metal film is grown on the seed layer within the via hole by the plating. In any of these conventionally known methods, when the via hole has an aspect ratio higher than 4, a void is unavoidably formed within the plug. This is because, in the first method, the metal film cannot be filled in the via hole without forming a void, and in the second method, the seed layer cannot be uniformly formed on the bottom of the via hole.

However, in this embodiment, after forming the first interlayer insulating film 107 on the second metal film 105, the via holes 109 are formed in the first interlayer insulating film 107 so as to expose the second metal film 105 within the via holes 109. Therefore, a seed layer of the second metal film 105 having a uniform desired thickness can be definitely formed on the bottoms of the via holes 109, and hence, the third metal film 111 can be definitely grown on the second metal film 105 within the via holes 109. As a result, the plugs 112 can be free from voids.

Although the third metal film 111 is grown by the plating in this embodiment, the third metal film 111 may be selectively grown on the second metal film 105 within the via holes 109 by selective CVD instead.

<Fifth Process>

The fifth process for forming a metal interconnect will now be described with reference to FIGS. 6, 12B, 12C, 13A through 13C and 14A.

Figure 12B:
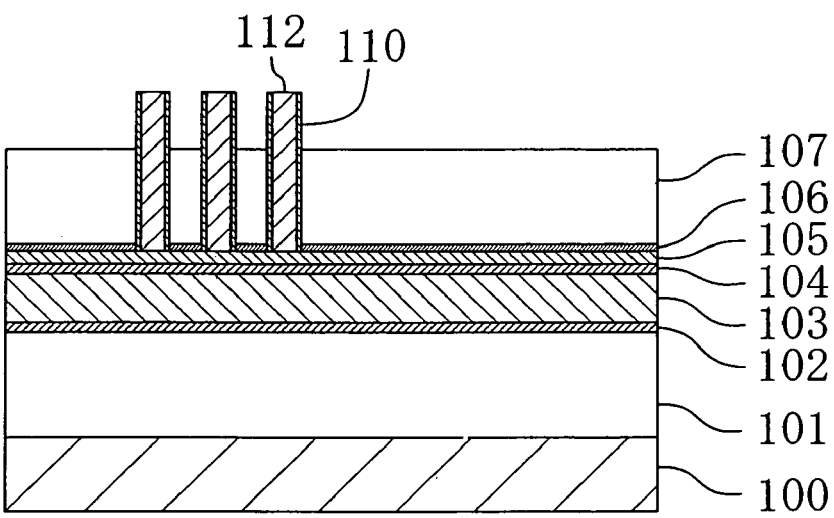

First, as shown in FIG. 12B, the first inter-layer insulating film 107 is etched, thereby reducing the thickness of the first interlayer insulating film 107 and allowing the plugs 112 to protrude from the first interlayer insulating film 107 with the reduced thickness.

Figure 12C:
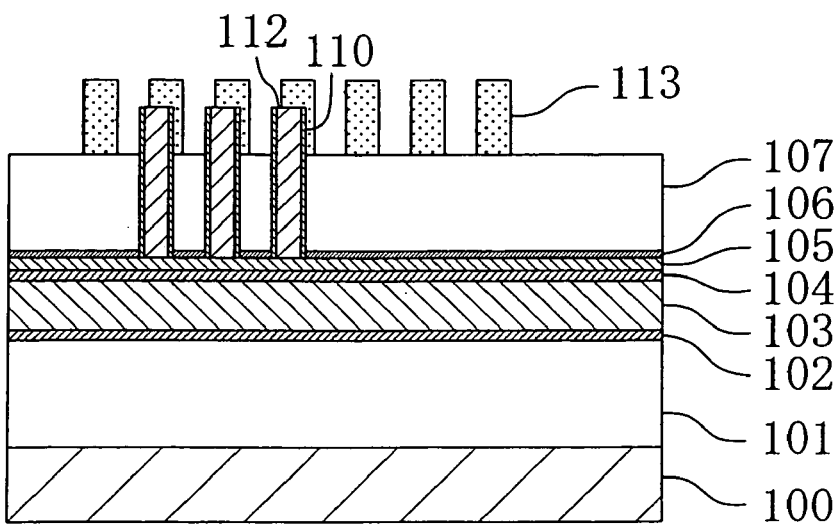
Figure 13A:
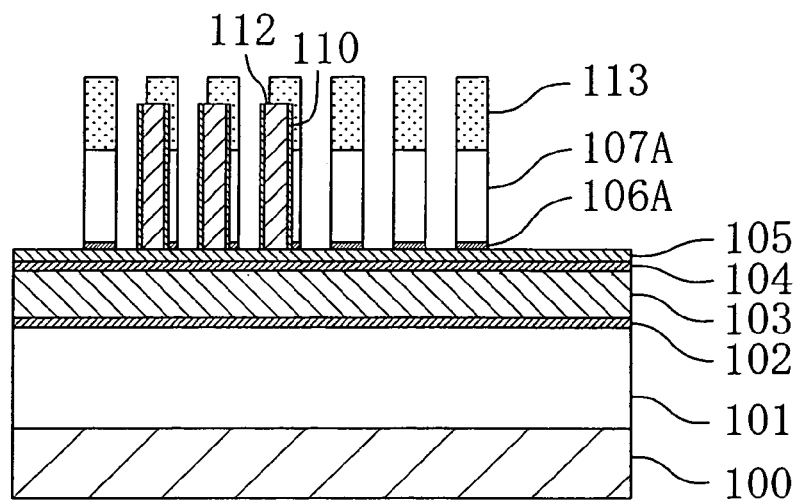
FIGS. 13A, 13B and 13C are cross-sectional views for showing still other procedures in the method for fabricating a semiconductor device of Embodiment 1.

Next, as shown in FIG. 12C, after forming a second mask pattern 113 on the first interlayer insulating film 107, the first interlayer insulating film 107 and the diffusion preventing film 106 are subjected to plasma etching using a gas including flon as a principal constituent with the second mask pattern 113 used as a mask. Thus, a patterned first interlayer insulating film 107A and a patterned diffusion preventing film 106A are formed as shown in FIG. 13A.

The second mask pattern 113 is preferably a resist pattern when the first interlayer insulating film 107 is not an organic film and is preferably a hard mask of a silicon oxide film or the like when the first interlayer insulating film 107 is an organic film.

The plasma etching of the first interlayer insulating film 107 and the diffusion preventing film 106 can be continuously carried out or separately carried out in two procedures.

Figure 13B:
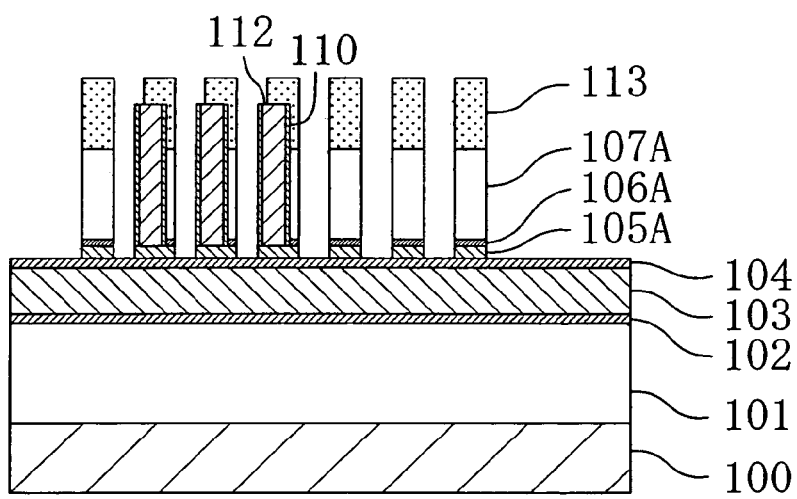
Figure 13C:
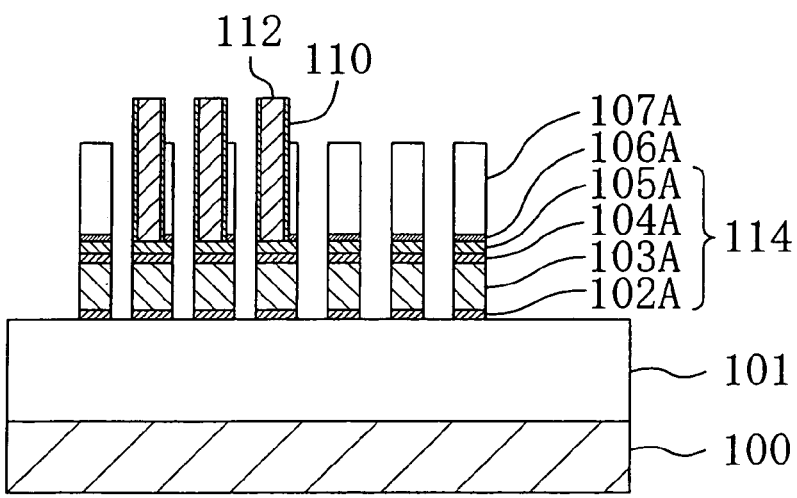

Then, the second metal film 105 is dry etched by using the second mask pattern 113, the plugs 112 and the patterned first interlayer insulating film 107A as a mask, thereby forming a patterned second metal film 105A as shown in FIG. 13B. Thereafter, the second barrier metal layer 104, the first metal film 103 and the first barrier metal layer 102 are dry etched by using the plugs 112 and the patterned first interlayer insulating film 107A as a mask, thereby forming a patterned second barrier metal layer 104A, a patterned first metal film 103A and a patterned first barrier metal layer 102A as shown in FIG. 13C. Thus, metal interconnects 114 each composed of the patterned second metal film 105A, the patterned second barrier metal 104A, the patterned first metal film 103A and the patterned first barrier metal layer 102A are formed.

The etching of the second metal film 105 and the etching of the second barrier metal layer 104, the first metal film 103 and the first barrier metal layer 102 can be carried out by plasma etching using a gas including a chlorine gas, a bromine gas or an iodine gas as a principal constituent, and may be continuously carried out or separately carried out in two procedures.

Both the etching of the second metal film 105 and the etching of the second barrier metal layer 104, the first metal film 103 and the first barrier metal layer 102 are carried out by using the plugs 112 and the patterned first interlayer insulating film 107A as the mask. Therefore, the metal interconnects 114 composed of the patterned first barrier metal layer 102A, the patterned first metal film 103A, the patterned second barrier metal layer 104A and the patterned second metal film 105A and the plugs 112 have the self-alignment structure. Accordingly, the metal interconnects 114 and the plugs 112 can be finely processed without causing positional shift therebetween.

Next, although not shown in the drawing, a remaining portion of the second mask pattern 113 is removed by ashing and the semiconductor substrate is then cleaned.

Figure 14A:
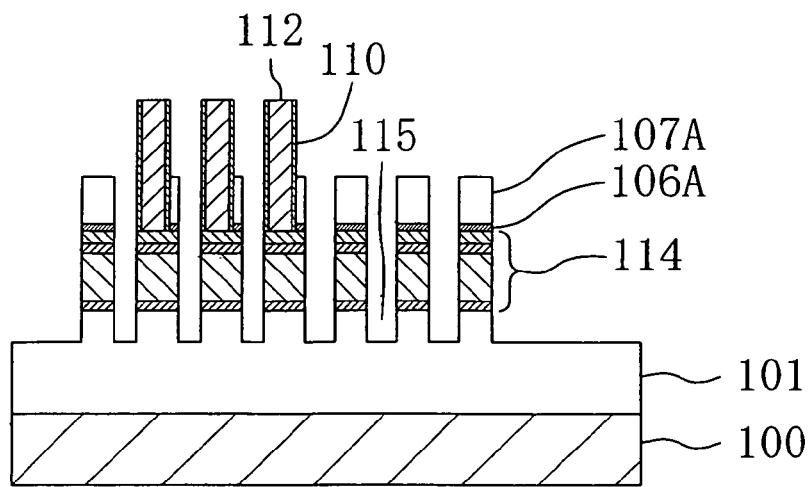
FIGS. 14A, 14B and 14C are cross-sectional views for showing still other procedures in the method for fabricating a semiconductor device of Embodiment 1.

Then, the patterned first interlayer insulating film 107A and the insulating film 101 are dry etched, thereby reducing the thickness of the patterned first interlayer insulating film 107A and forming grooves 115 in the insulating film 101 by reducing the thickness of the insulating film 101 as shown in FIG. 14A.

<Sixth Process>

The sixth process for forming a second interlayer insulating film will now be described with reference to FIGS. 7 and 14B.

Figure 14B:
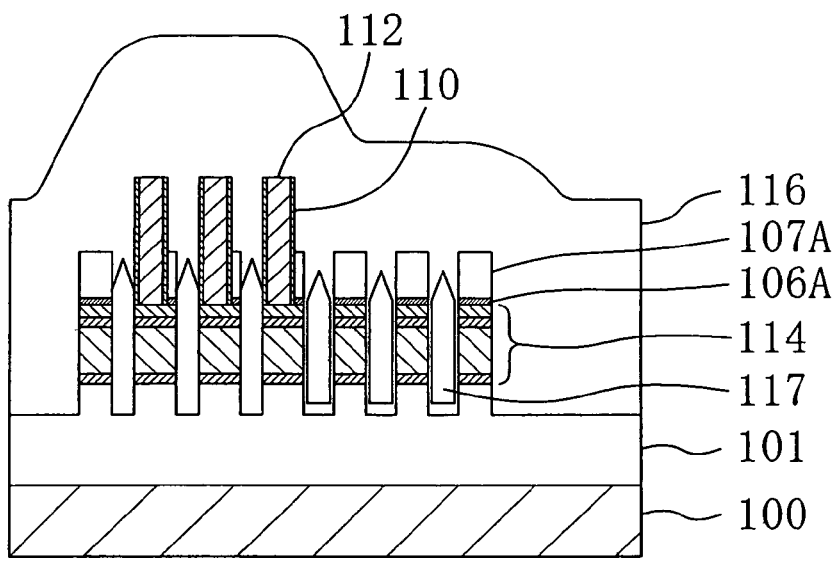

As shown in FIG. 14B, a second interlayer insulating film 116 is deposited over the semiconductor substrate 100 by the CVD, thereby forming air gaps 117 between the metal interconnects 114.

<Seventh Process>

The seventh process for planarizing the second interlayer insulating film will now be described with reference to FIGS. 8 and 14C.

Figure 14C:
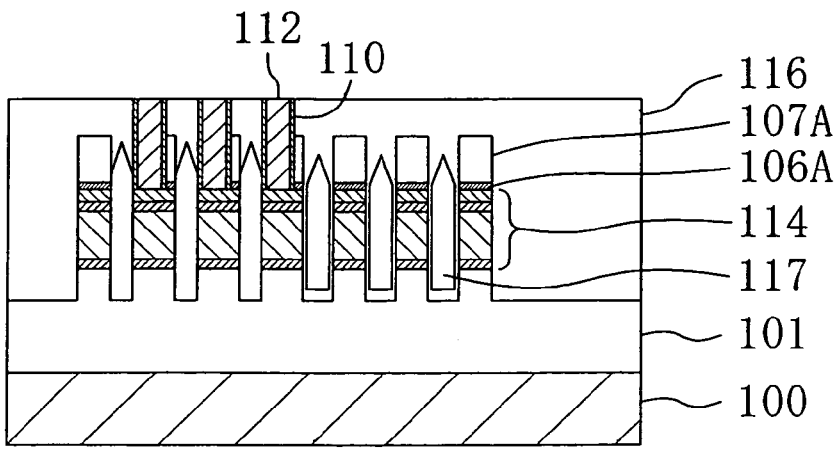

As shown in FIG. 14C, the second interlayer insulating film 116 is planarized by the CMP, thereby exposing the upper faces of the plugs 112.

Subsequently, the procedures described with reference to FIGS. 9B through 14C are repeatedly carried out, so as to form a multi-layer interconnect structure having air gaps.

Now, the relationship in interconnect resistance between the patterned first metal film 103A and the patterned second metal film 105A will be described.

As a first method, the interconnect resistance of the patterned first metal film 103A is set to substantially ⅕ or less of the interconnect resistance of the patterned second metal film 105A.

Thus, a current flowing through the metal interconnect 114 mainly flows through the patterned first metal film 103A. Therefore, the work is divided between these two metal films, so that the patterned first metal film 103A can work as an interconnect and the second metal film 105 can work as a seed layer for growing the third metal film 111.

Accordingly, the first metal film 103 can be made from a metal material with low resistance, such as aluminum, and the second metal film 105 can be made from a metal material capable of easily growing the third metal film by the plating, such as copper.

As a second method, the interconnect resistance of the patterned first metal film 103A is set to be substantially equal to the interconnect resistance of the patterned second metal film 105A.

Thus, the phase in a distributed constant circuit of a current flowing through the patterned first metal film 103A and the phase in a distributed constant circuit of a current flowing through the patterned second metal film 105A are substantially the same over the entire metal interconnects 114. Therefore, turbulence of a signal propagated by a current flowing through the metal interconnect 114 can be minimized. A specific method for substantially equalizing the interconnect resistances will be described in detail in Embodiment 3 below.

Embodiment 2

Figure 15:
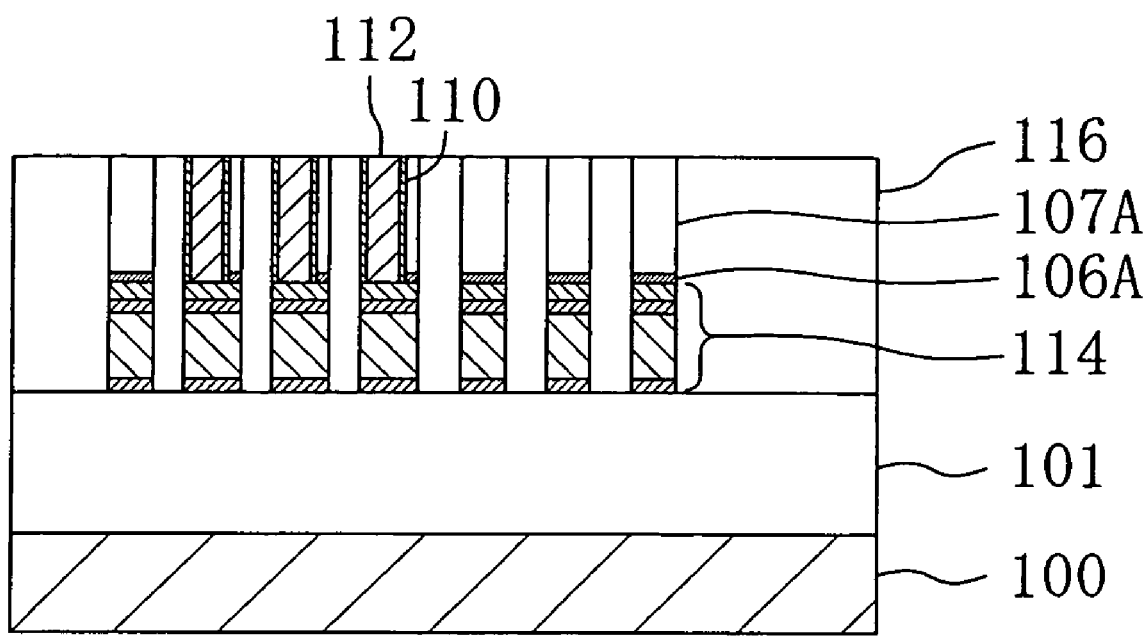
FIG. 15 is a cross-sectional view of a semiconductor device according to Embodiment 2 of the invention.

A semiconductor device and a method for fabricating the same according to Embodiment 2 of the invention will now be described with reference to FIG. 15.

The semiconductor device of Embodiment 2 is different from the semiconductor device of Embodiment 1 in having no grooves 115 (like those shown in FIG. 14A) in the insulating film 101 and having no air gaps 117 (like those shown in FIG. 14C) between the metal interconnects 114.

In order to fabricate the semiconductor device of Embodiment 2, the procedure for reducing the thickness of the first interlayer insulating film 107 by etching the first interlayer insulating film 107 described with reference to FIG. 12B and the procedure for forming the grooves 115 in the insulating film 101 by etching the insulating film 101 described with reference to FIG. 14A are omitted in the method for fabricating a semiconductor device of Embodiment 1. Thus, an interconnect structure having no air gap 117 between the metal interconnects 114 can be formed.

Also in Embodiment 2, the plugs 112 and the metal interconnects 114 have the self-alignment structure, and hence, the metal interconnects 114 and the plugs 112 can be finely processed without causing positional shift therebetween.

Furthermore, since the third metal film 111 is grown within the via holes 109 by the plating, the plugs 112 can be free from voids.

Embodiment 3

A semiconductor device according to Embodiment 3 of the invention will now be described with reference to FIGS. 16A and 16B.

Figure 16A:
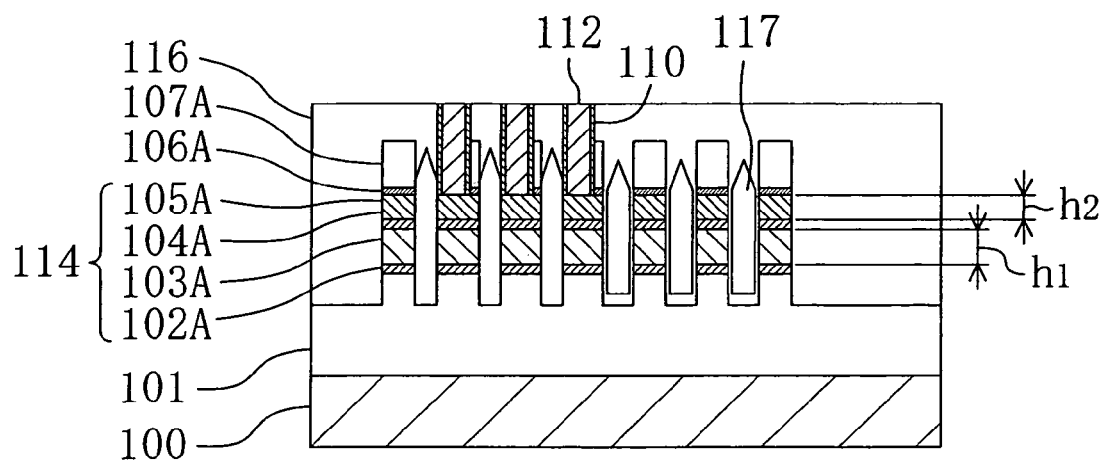
FIGS. 16A and 16B are cross-sectional views of a semiconductor device according to Embodiment 3 of the invention.
Figure 16B:
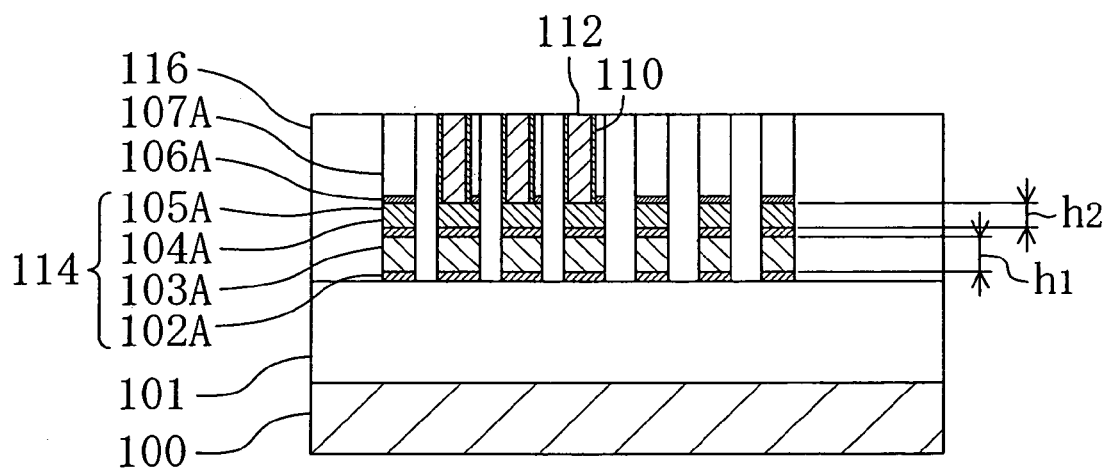
Figure 17A:
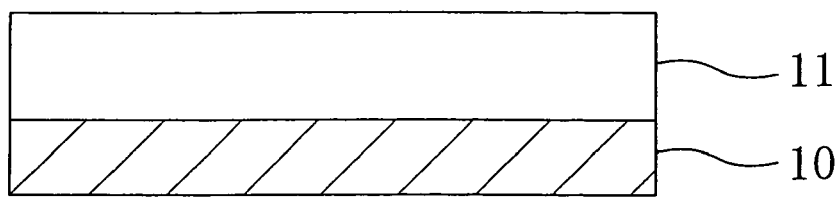
FIGS. 17A, 17B, 17C and 17D are cross-sectional views for showing procedures in a conventional method for fabricating a semiconductor device.
Figure 17B:
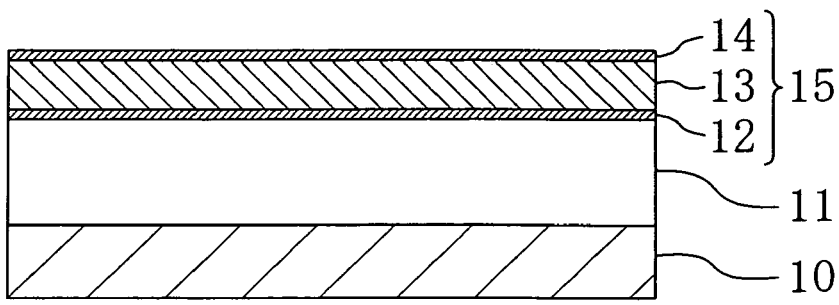
Figure 17C:
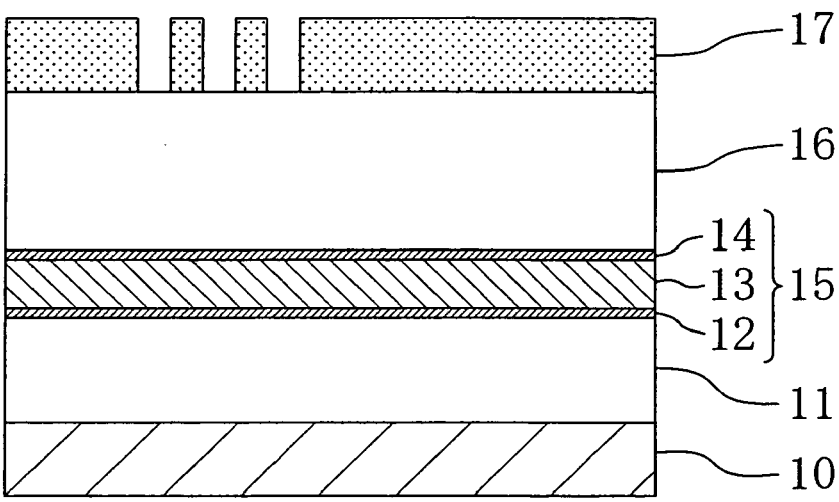
Figure 17D:
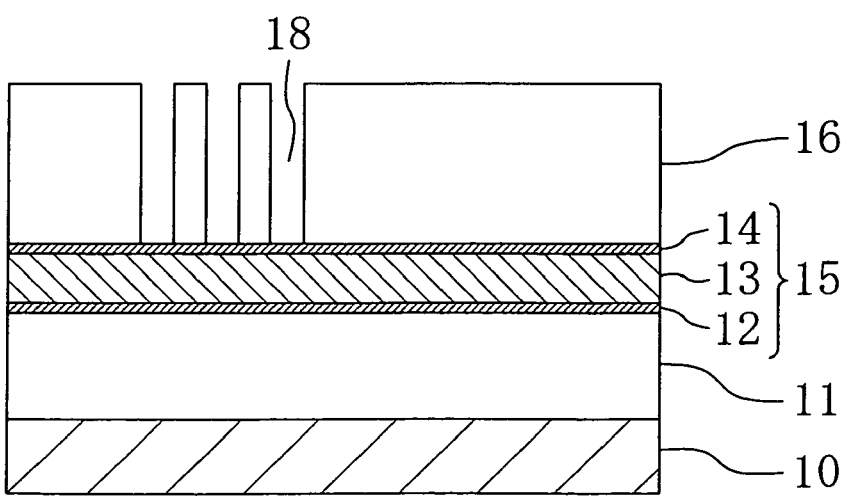
Figure 18A:
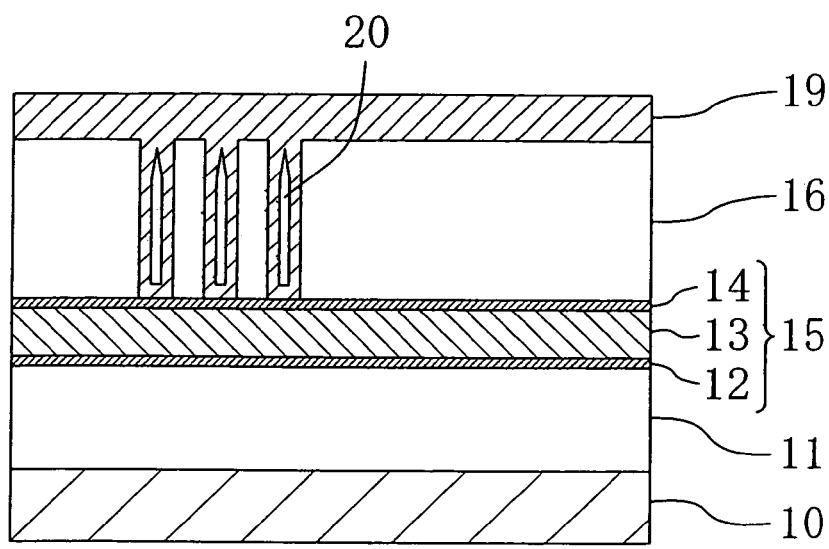
FIGS. 18A, 18B and 18C are cross-sectional views for showing other procedures in the conventional method for fabricating a semiconductor device.
Figure 18B:
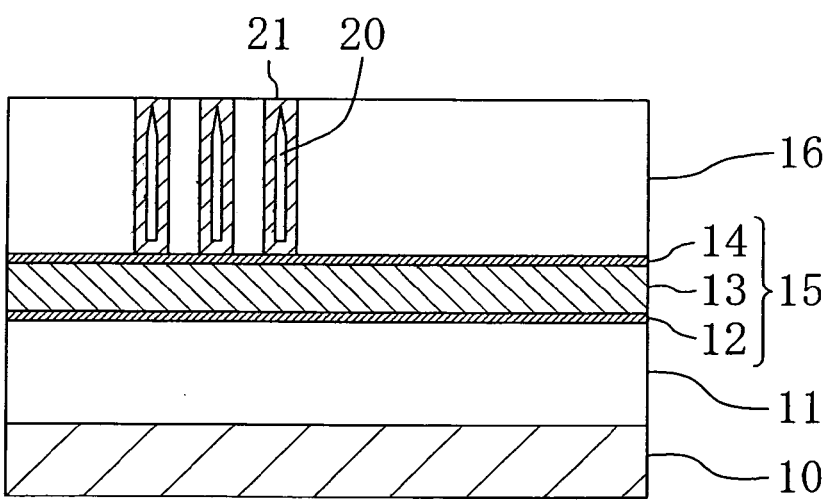
Figure 18C:
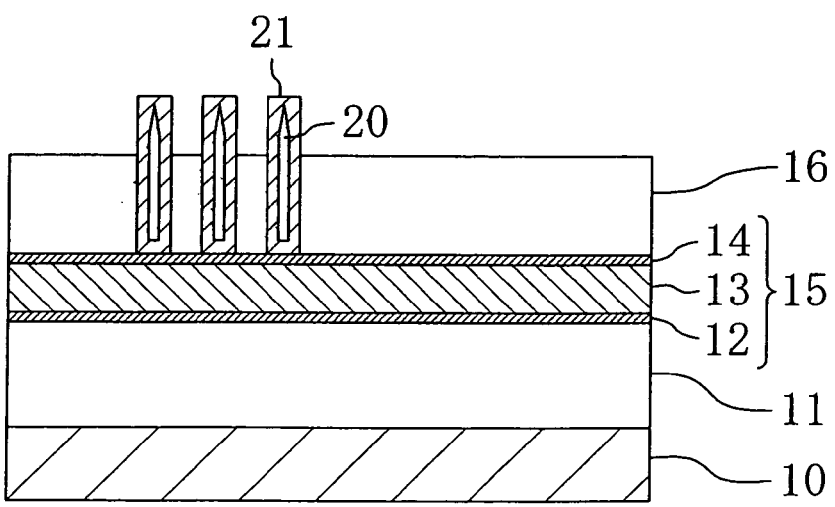
Figure 19A:
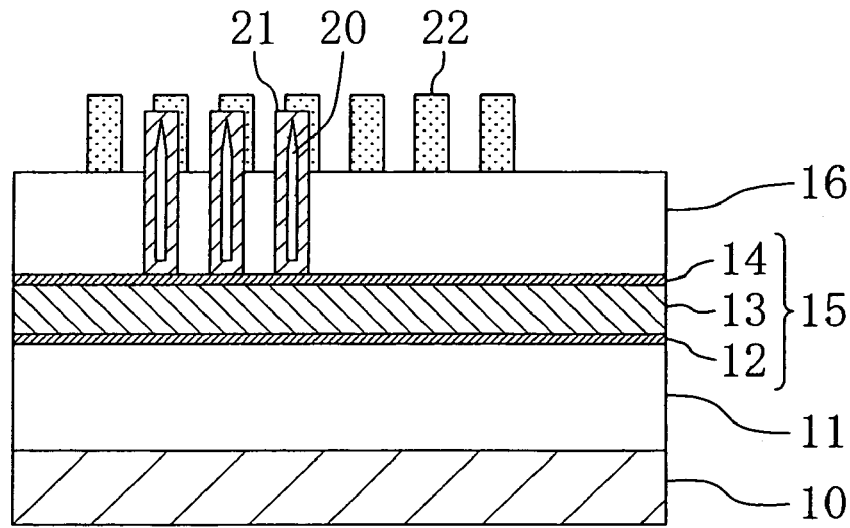
FIGS. 19A, 19B and 19C are cross-sectional views for showing still other procedures in the conventional method for fabricating a semiconductor device.
Figure 19B:
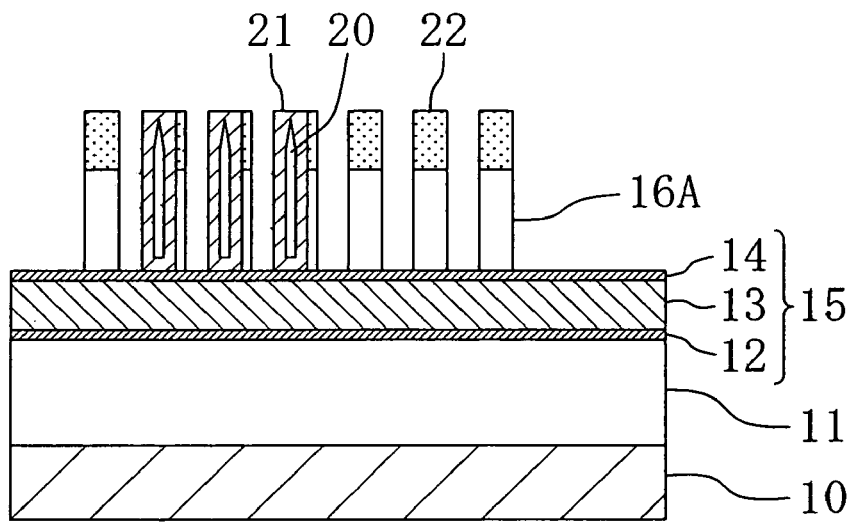
Figure 19C:
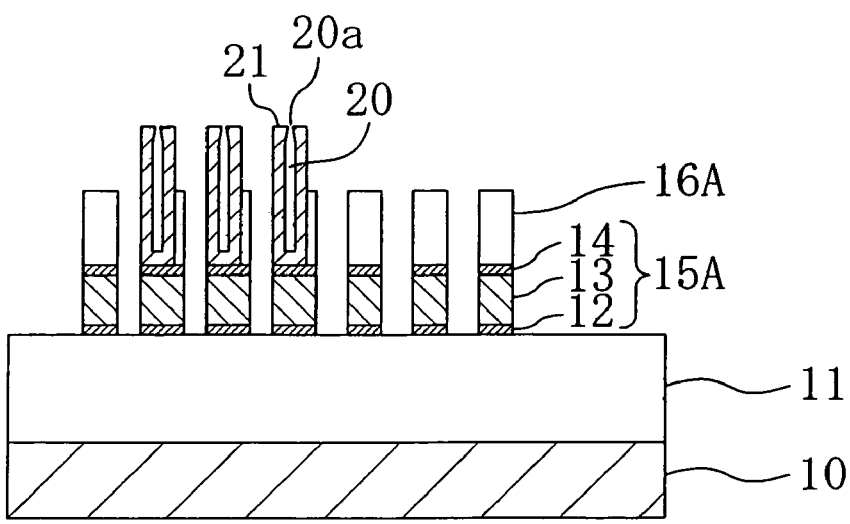
Figure 20A:
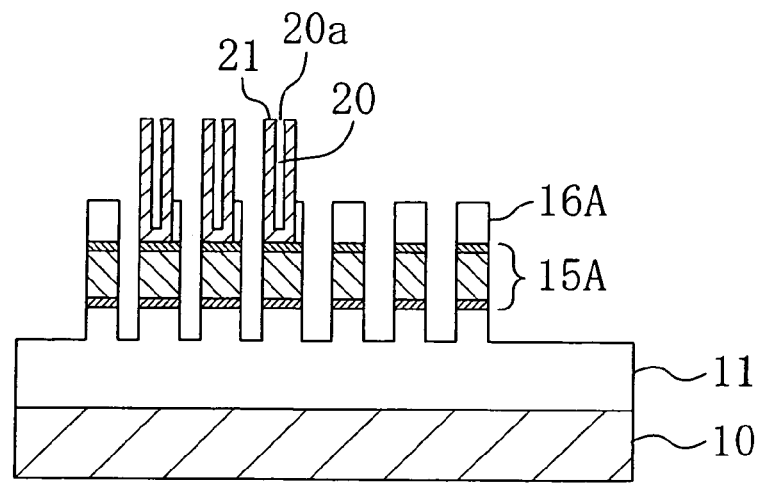
FIGS. 20A, 20B and 20C are cross-sectional views for showing still other procedures in the conventional method for fabricating a semiconductor device.
Figure 20B:
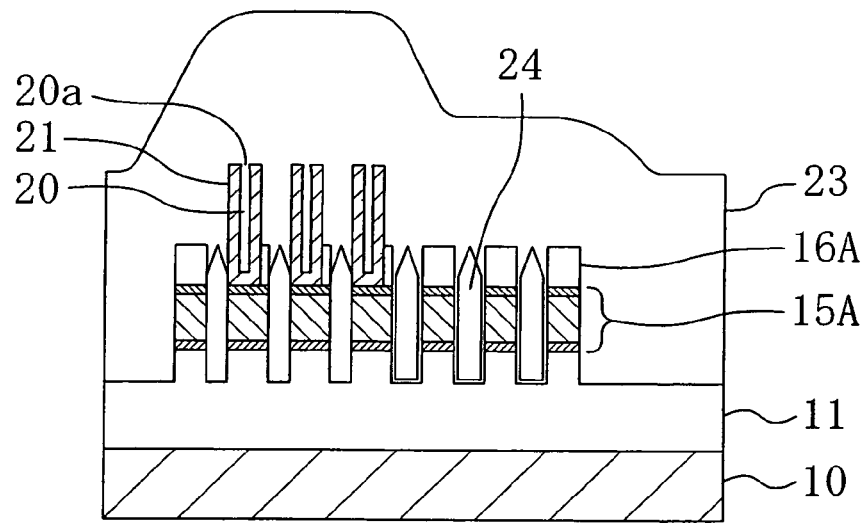
Figure 20C:
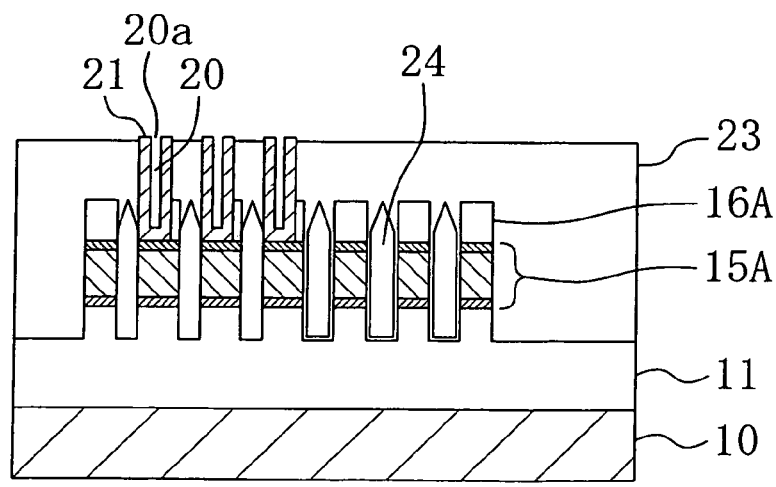

FIG. 16A shows the semiconductor device of Embodiment 3 fabricated by the fabrication method of Embodiment 1, and FIG. 16B shows the semiconductor device of Embodiment 3 fabricated by the fabrication method of Embodiment 2.

As a characteristic of the semiconductor device of Embodiment 3, no matter which structure is employed, the thickness $h_1$ of the patterned first metal film 103A and the thickness $h_2$ of the patterned second metal film 105A are set so as to substantially equalize the interconnect resistance of the patterned first metal film 103A and the interconnect resistance of the patterned second metal film 105A.

Thus, the phase in a distributed constant circuit of a current flowing through the patterned first metal film 103A and the phase in a distributed constant circuit of a current flowing through the patterned second metal film 105A are substantially the same over the entire metal interconnects 114. Therefore, turbulence of a signal propagated by a current flowing through the metal interconnect 114 can be minimized.

For example, in the case where the first metal film 103 is made from aluminum alloy and the second metal film 105 is made from copper, the electric resistance at 20° C. is 2.69 ($\mu\Omega\cdot$cm) in aluminum alloy and is 1.696 ($\mu\Omega\cdot$cm) in copper. Accordingly, in order to equalize the interconnect resistances of the patterned first metal film 103A and the patterned second metal film 105A that are processed to have the same line width, the thicknesses of the first metal film 103 and the second metal film 105 are controlled so that the ratio between their thicknesses ($h_1/h_2$) can be approximately 1.6.

Since the allowable range of the value of the thickness ratio ($h_1/h_2$) is approximately ±10%, the value is practically approximately 1.4 through 1.8.

What is claimed is:

1. A method for fabricating a semiconductor device comprising the steps of:
    depositing a first metal film on a semiconductor substrate with an insulating film sandwiched therebetween;
    depositing a second metal film on said first metal film;
    forming an interlayer insulating film on said second metal film;
    forming a via hole in said interlayer insulating film;
    forming an adhesive layer on said via hole;
    then, removing a part of said adhesive layer present on a bottom of said via hole selectively so as to expose a surface of said second metal film only at the bottom of said via hole;
    forming a plug of a third metal film selectively grown on the exposed surface of said second metal film within said via hole;
    forming a patterned interlayer insulating film by patterning said interlayer insulating film into the shape of interconnects; and
    forming metal interconnects from a multi-layer film composed of said first metal film and said second metal film by etching said multi-layer film with said plug and said patterned interlayer insulating film used as a mask,
    wherein said first metal film is an interconnected layer and said second metal film is a seed layer, and
    said plug is in contact with said seed layer only at the bottom of said via hole.

2. The method for fabricating a semiconductor device of claim 1,
    wherein said third metal film is grown by plating.

3. The method for fabricating a semiconductor device of claim 1,
    wherein said second metal film and said third metal film are made from the same type of metal.

4. The method for fabricating a semiconductor device of claim 1,
    wherein said second metal film and said third metal film are made from a metal including copper as a principal constituent, and
    said third metal film is grown by plating an said second metal film with no adhesive layer sandwiched therebetween.

5. A semiconductor device, comprising:
    metal interconnects formed on a semiconductor substrate with an insulating film sandwiched therebetween, and the metal interconnects including a first metal film of a lower layer and a second metal film of an upper layer;
    an interlayer insulating film formed over the metal interconnects;
    a via hole formed in the interlayer insulating film;
    a plug made from a third metal film formed within the via hole,
    wherein the first metal film is an interconnect Layer and the second metal film is a seed layer, and
    the plug is in contact with said seed layer only at the bottom of said via hole.

6. The semiconductor device of claim 5, further comprising an adhesive layer formed only on walls of the via hole.

7. The semiconductor device of claim 6,
    wherein the adhesive layer is made of a silicon nitride film or a silicon carbide film.

8. The semiconductor device of claim 5,
    wherein no seed layer is formed within the via hole.

9. The semiconductor device of claim 5,
    wherein the interlayer insulating film is formed on the metal interconnects, and includes a patterned first interlayer insulating film and a second interlayer insulating film formed over the first interlayer insulating film.

10. A method for fabricating a semiconductor device comprising the steps of:
    depositing first metal film on a semiconductor substrate with an insulating film sandwiched therebetween;
    depositing a second metal film on said first metal film;
    forming an interlayer insulating film on said second metal film;
    forming a via hole in said interlayer insulating film so as to expose a surface of said second metal film only at the bottom of said via hole,
    forming a plug of a third metal film selectively grown on the exposed surface of said second metal film within said via hole;
    forming a patterned interlayer insulating film by patterning said interlayer insulating film into the shape of interconnects; and
    forming metal interconnects from a multi-layer film composed of said first metal film and said second metal film by etching said multi-layer film with said plug and said patterned interlayer insulating film used as a mask,
    wherein said first metal film is an interconnected layer and said second metal film is a seed layer, and
    said plug is in contact with said seed layer only at the bottom of said via hole;
    wherein the step of forming said via hole so as to expose the surface of said second metal film only at the bottom of said via hole includes the steps of:
    depositing an adhesive layer over walls and the bottom of said via hole, and
    performing an anisotropic etching with respect to said adhesive layer so as to have said adhesive layer only on the walls of said via hole.

* * * * *

UNITED STATES PATENT AND TRADEMARK OFFICE
CERTIFICATE OF CORRECTION

PATENT NO. : 7,144,761 B2 Page 1 of 1
APPLICATION NO. : 10/958282
DATED : December 5, 2006
INVENTOR(S) : Hideo Nakagawa et al.

It is certified that error appears in the above-identified patent and that said Letters Patent is hereby corrected as shown below:

claim 4, column 12, line 1, "an said" should read --on said--.

claim 5, column 12, line 14, "interconnect Layer" should read --interconnect layer--.

Signed and Sealed this

Tenth Day of November, 2009

David J. Kappos
*Director of the United States Patent and Trademark Office*